United States Patent [19]
Adachi et al.

[11] Patent Number: 5,303,198
[45] Date of Patent: Apr. 12, 1994

[54] METHOD OF RECORDING DATA IN MEMORY CARD HAVING EEPROM AND MEMORY CARD SYSTEM USING THE SAME

[75] Inventors: Kaoru Adachi; Kouichi Gouhara, both of Tokyo, Japan

[73] Assignee: Fuji Photo Film Co., Ltd., Kanagawa, Japan

[21] Appl. No.: 726,173

[22] Filed: Jul. 5, 1991

[30] Foreign Application Priority Data

Sep. 28, 1990 [JP] Japan .................. 2-257374
Sep. 28, 1990 [JP] Japan .................. 2-257375

[51] Int. Cl.$^5$ .............................................. G11C 7/00
[52] U.S. Cl. ...................................... 365/218; 365/210
[58] Field of Search ............... 365/200, 201, 210, 218, 365/222

[56] References Cited

U.S. PATENT DOCUMENTS 4,982,378  1/1991  Matsushita .................. 365/221 X
5,119,338  6/1992  Saito ................................ 365/222

FOREIGN PATENT DOCUMENTS

0213534  3/1987  European Pat. Off. .
0282926  9/1988  European Pat. Off. .
59-71179  4/1984  Japan .
59-77699  5/1984  Japan .
60-3081   1/1985  Japan .

Primary Examiner—Steven Mottola

[57] ABSTRACT

A method of recording data in a memory card having an EEPROM, and a memory card system using the same are provided. A memory card has at least two collective erasure type EEPROM chips where at least one of which is conditioned for a spare memory. When an access of the kind needing overwriting is made to the memory card, data stored in memory locations of the addresses of a corresponding EEPROM chip, except for the address where overwriting is to occur, are copied in the spare memory, and then the EEPROM chip of interest and the spare memory are replaced with each other. The EEPROM chips may be replaced with a plurality of memory blocks or clusters defined in a block erasure type EEPROM.

4 Claims, 8 Drawing Sheets

METHOD OF RECORDING DATA IN MEMORY CARD HAVING EEPROM AND MEMORY CARD SYSTEM USING THE SAME

BACKGROUND OF THE INVENTION

1. Field of the Invention

The present invention relates to a data recording method for a memory card in which data such as picture data or character data may be stored, and a memory card system using the same. More particularly, the present invention is concerned with a method of recording data in a memory card having an EEPROM (Electrically Erasable Programmable Read Only Memory), and a memory card system using such a method.

2. Description of the Related Art

Today, a memory card using a semiconductor memory is predominant over a disket as means for recording data such as picture data generated by an electronic still camera or character data generated by a word processor, because the former is far smaller in size than the latter. It has been customary with a memory card for such an application to implement the semiconductor memory as an SRAM (Static Random Access Memory) which promotes rapid data reading and writing operations. However, because an SRAM is a volatile semiconductor memory, a memory card with an SRAM needs a back-up battery for preventing data from disappearing. Another problem is that an SRAM capable of storing a great amount of data such as picture data is expensive, increasing the overall cost of a memory card implemented thereby.

In light of the above discussion, a memory card with an EEPROM which is non-volatile and, therefore, does not need a back-up battery and is inexpensive is now under investigation. An EEPROM is capable of holding data therein for more than ten years without a battery. Some advanced EEPROMs are comparable with an SRAM in respect of the reading and writing rates and are less expensive (about one-fourth the cost of an SRAM). However, an EEPROM brings about other problems when it comes to the application to a memory card, as follows. With an EEPROM, it is necessary to give consideration to the processing for the erasure of data due to the nature of the device. Hence, a memory card with an EEPROM has to be provided with extra pins, or the system using such a memory card needs a special implementation. For this reason, a memory card with EEPROMs is not readily compatible with a conventional memory card with an SRAM. Specifically, data stored in an EEPROM cannot be rewritten by overwriting, i.e., such data has to be erased and then replaced with new data. Therefore, a memory card with an EEPROM needs extra pins for erasure which are not necessary is a memory card with an SRAM.

EEPROMs are generally classified into two types, i.e., an EEPROM of the type which erases all the data at one time and an EEPROM of the type erasing a predetermined block of data at a time. Although the block erasure type EEPROM can be dealt with in the same manner as an SRAM, it is more expensive than the collective erasure type EEPROM. On the other hand, the collective erasure or flushing type EEPROM cannot freely perform byte-by-byte data rewriting and, therefore, needs a special consideration in the aspect of use.

Furthermore, with an EEPROM, the total number of times that data can be erased and written is limited, e.g., from about 100 times to 10,000 times. Especially, the service life of the above-mentioned block erasure type EEPROM is noticeably reduced when repetitive writing concentrates in a particular location thereof.

SUMMARY OF THE INVENTION

It is therefore an object of the present invention to provide a recording method which insures the compatibility of a memory card having an EEPROM with a memory card having a conventional SRAM, and a memory card system practicable with such a method.

It is another object of the present invention to provide a recording method which extends the service life of a memory card with an EEPROM, and a memory card system using such a method.

In accordance with the present invention, a method of recording data in a memory card having a main memory which is implemented by a collective erasure type EEPROM comprises the steps of providing the memory card with at least two EEPROMs having an identical capacity and conditioning at least one of the EEPROMs for a spare memory in which no data is stored, copying, in response to an access which is to rewrite data stored in one of the EEPROMs, all of the data of the one EEPROM except for data stored in the address to rewrite in the spare memory, replacing the relative addresses of the spare memory and one EEPROM of interest to convert the spare memory to a data holding memory, collectively erasing the one memory to convert the one memory to a spare memory, and writing in a storage location of a non-occupied address of the EEPROM having been converted to a data holding memory data which had been interrupted, thereby rewriting data.

Also, in accordance with the present invention, a memory card system using a memory card which has a main memory implemented as a collective erasure type EEPROM comprises a main memory section made up of at least two EEPROMs having an identical capacity, at least one of the EEPROMs being conditioned for a spare memory in which no data is stored, an address generator for holding a write address of data to be written to the main memory section and generating, when one of the EEPROMs corresponding to the write address has already stored data, addresses for copying all of the data stored in the one EEPROM except for data stored in a storage location of the write address in the spare memory, a data controller for writing and reading data out of the main memory section and temporarily holding, while data of the one EEPROM are copied in the spare memory in the main memory section, data to be written, a chip selection controller for selectively feeding an enable signal to one of the EEPROMs for writing or reading data and replacing, when data of one of the EEPROMs are copied in the spare memory in the main memory section, the relative addresses of the one EEPROM and the spare memory, a non-volatile RAM for storing a memory supervising table which supervises storage conditions of the main memory section when a power source is turned off and a selection condition of the chip selection controller just before the turn-off of the power source, a control signal generator for generating a timing signal for writing data in the EEPROMs of the main memory section, a timing signal for reading data out of the EEPROMs, and a timing signal for erasing data stored in the EEPROMs, and a system control for determining, in response to an input signal or an output signal from a host to or from which data are to be inputted or outputted, conditions of the main memory section on the basis of the contents of the memory supervising table to thereby control the main memory section, the address generator, the data controller, the chip selection controller, the non-volatile RAM, and the control signal generator, thereby moving, writing or reading data.

Further, in accordance with the present invention, a method of recording data in a memory card having a main memory implemented as a block erasure type EEPROM comprises the steps of conditioning at least one of a plurality of memory blocks constituting the EEPROM for a spare block in which no data is stored, replacing, when an access of the kind needing overwriting is made to any one of the memory blocks which store data, the relative addresses of the one memory block and the spare block, erasing data stored in the one memory block to convert the data to a substitute spare block, and writing data associated with the access in the one memory block which was a spare block so as to convert the at least one memory block to a data holding block.

Moreover, in accordance with the present invention, a memory card system using a memory card having a main memory which is implemented as a block erasure type EEPROM includes a main memory section comprising the EEPROM having a plurality of memory blocks at least one of which is conditioned for a spare block in which no data is stored, a main memory supervising memory for memorizing the relative addresses of the memory blocks of the main memory section, whether or not each of the memory blocks stores data, and conditions in which the memory blocks hold data, a block selector for reading a logical address sent from a host and selecting one of the memory blocks which is designated by the logical address, and a system controller for controlling the main memory section, the main memory supervising memory, and the block selector in response to a control signal sent from the host. The block selector comprises a decision circuit for reading and determining, when the logical address is an address for writing, conditions in which data are stored in storage locations of the addresses of the memory block stored in the main memory supervising table, a replacing circuit for replacing, when the decision means determines that the memory block stores data, the relative addresses of the memory block and the spare block and then writing the replaced relative addresses in the main memory supervising memory, and a selecting circuit for selecting the memory block which was the spare block as a block designated by the logical address. The system control comprises an erasing circuit for erasing data of the memory block whose address has been converted to the address of the spare block by the replacing means of the block selector.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 1:
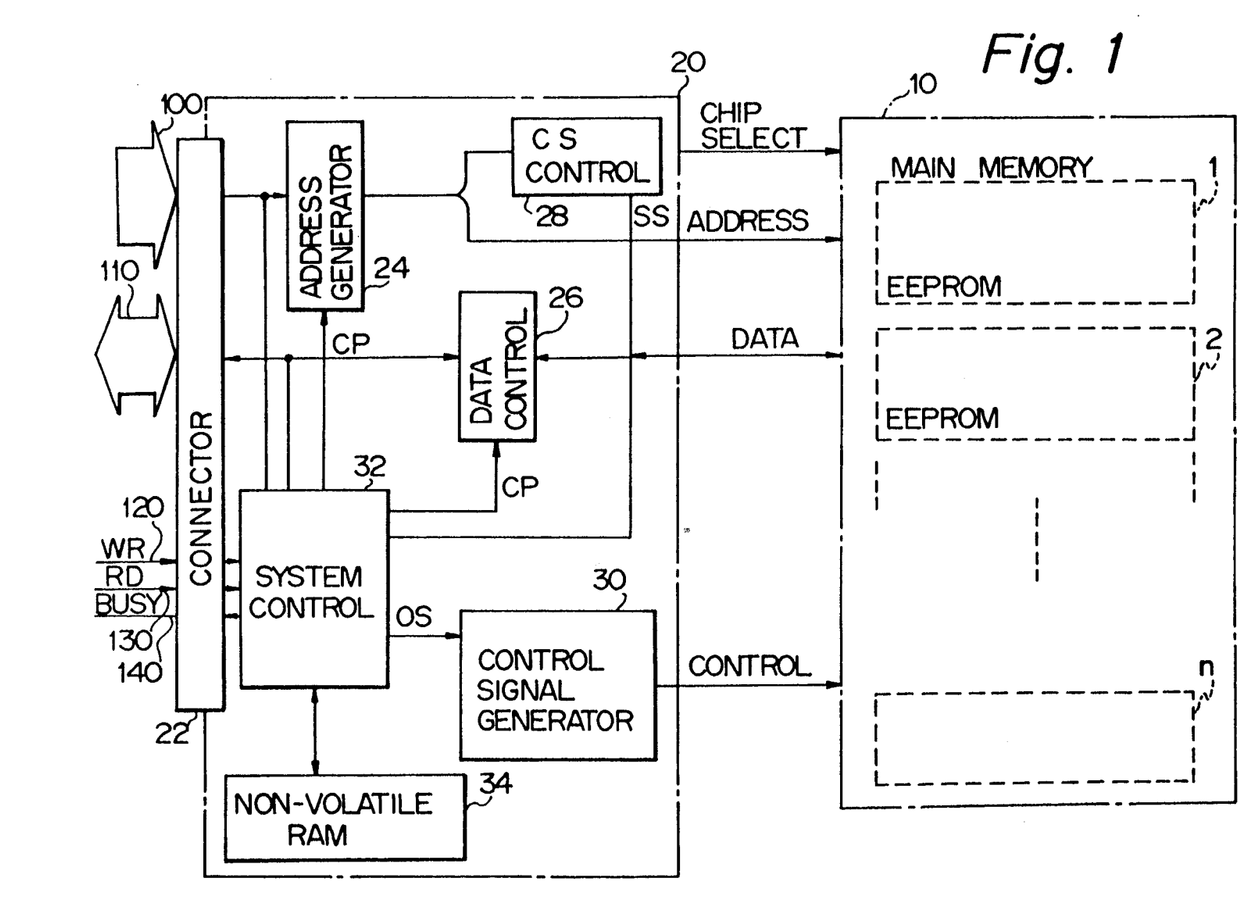
FIG. 1 is a block diagram schematically showing an embodiment of the memory card in accordance with the present invention.

Referring to FIGS. 1-4, a method of recording data in a memory card and a memory card system embodying the present invention will be described. As shown in FIG. 1, a memory card is generally made up of a main memory section 10 and a control section 20. The main memory section 10 stores data while the control section 20 controls the reading and writing of data in the main memory section 10.

The main memory section 10 is implemented as a plurality of EEPROM chips 1, 2, ..., n of the same standard and capacity. At least one of the chips 1, 2, ..., n serves as a spare memory in which no data is stored. The EEPROM chip functions as a spare memory will be used when data is to be overwritten in any of the other chips which has already stored data. Specifically, when data is to be overwritten in a given chip, the spare memory is accessed to copy all the data stored in the storage locations of the addresses of the chip of interest except for the address where overwriting is expected to occur. As a result, the spare memory turns out to be a memory for holding data and allows data to be written in a location of the unoccupied address thereof. At the same time, the chip whose data have been copied as mentioned above is erased to serve as a spare memory. In this manner, at least one spare memory exists in the main memory 10 at all times. Each of the chips 1, 2, ..., n is implemented as a collective erasure or a sort of flushing type EEPROM, i.e., all the contents stored therein become (logical) ONE in response to an erase signal. Data are written in or read out of each of the chips 1, 2, ..., n byte by byte.

The control section 20 has a connector 22 connectable to an electronic still camera or similar host. The connector 22 has terminals to be connected to an address bus 100, a data bus 110, a write signal line 120, a read signal line 130, and a busy signal line 140. Further, the control section 20 has an address generator 24, a data control 26, a chip selection (CS) control 28, a control signal generator 30, a system control 32, and a non-volatile RAM 34. The address generator 24 receives from the host an address signal for writing or reading data and transfers the address signal to the main memory section 10. The data control 26 implements the bidirectional hand-over of data to be written or read out between the host and the main memory section 10. The chip selection control 28 feeds to the main memory section 10 a chip select signal which designates a particular one of the EEPROM chips 1, 2, ..., n for writing or reading data. The control signal generator 30 produces a control signal for writing data, reading data, or erasing data stored in the main memory section 10. The system control 32 controls such blocks 24-30. When the power source of the host is turned off, the non-volatile RAM 34 saves supervisory data existing in the system control 30.

The address generator 24 has a register, not shown, for holding an address which comes in through the connector 22 for writing or reading data. Also, the address generator 24 sequentially generates the addresses of an EEPROM chip of interest other than the above-mentioned address. Assume that a write signal from the host has arrived at the address generator 24, and that a memory location of the address of the EEPROM chip corresponding to the write address has already stored data. Then, the system control 32 delivers a copy signal CP to the address generator 24, indicating that a copying sequence will be executed in the main memory section 10. In response to the copy signal CP, the address generator 24 sequentially delivers to the main memory section 10 the addresses for rewriting except for the address having been held in the register, whereby data are transferred from the memory storing them to a spare memory. As the transfer of data completes, the address generator 24 feeds the address stored in the register thereof to the main memory section 10. In this manner, the address generator 24 serves two different functions at the same time, i.e., a function of transferring an address sent from the host to the main memory section 10 via the register, and a function of generating addresses for copying the addresses other than the address inputted to the register, i.e., data stored in the main memory section 10.

The data control 26 has a first and a second buffer memory, not shown. During an ordinary write mode operation, the data control 26 transfers data sent from the host to the main memory section 10 via the first buffer memory. During a read mode operation, the data control 26 sends data read out of the main memory section 10 to the host via the second buffer memory. When overwriting occurs in any of the EEPROM chips 1-n, the system control 32 delivers the previously mentioned copy signal CP to the data control 26. In response to this signal CP, the data control 26 holds data from the host temporarily in the first buffer memory and executes a procedure for transferring data from the chip of interest to another chip, or spare memory. On completing such a procedure, the data control 26 transfers the data from the first buffer memory to the main memory section 10.

The chip selection control 28 is connected to the enable terminals of the EEPROM chips 1-n constituting the main memory section 10. As the address generator 24 feeds an address signal to the chip selection control 28, the control 28 produces an enable signal for activating the enable terminal of any one of the chips 1-n. When overwriting occurs in the main memory section 10, the system control 32 delivers a select signal SS to the chip selection control 28 to cause the chip selection control 28 to change the destination of the enable signal. As a result, the relative addresses of EEPROM chips replaced with each other in the main memory section 10 are changed. Hence, the destination to which an address should be fed from the address generator 24 is accurately changed.

The control signal generator 30 selectively generates a timing signal for writing data, a timing signal for reading data, and a timing signal for erasing data. These timing signals are fed to EEPROM chips 1-n of the main memory section 10 in response to a command signal OS from the system control 32.

The system control 32 receives a write signal WR or a read signal RD from the host via the connector 22 and, after identifying such a signal WR or RD, controls the various blocks 24-30 of the control section 20 accordingly. The system control 32 has a memory supervising table for supervising the occupied/unoccupied condition of the main memory section 10 address by address. On receiving an address signal, the system control 32 looks up this supervising table to see the state of the corresponding address of the EEPROM chip and, if data is to be overwritten, causes the contents of the chip of interest to be copied in a spare memory.

The non-volatile RAM 34 plays the role of a table holding unit for saving, on the turn-off of the power source of the host, the memory supervising table of the system control 32 and the EEPROM selection state of the chip selection control 28 which has occurred just before the turn-off of the power source.

A reference will be made to FIGS. 2-7 for describing specific operations of the memory card and the data recording method particular to the illustrative embodiment.

Figure 3:
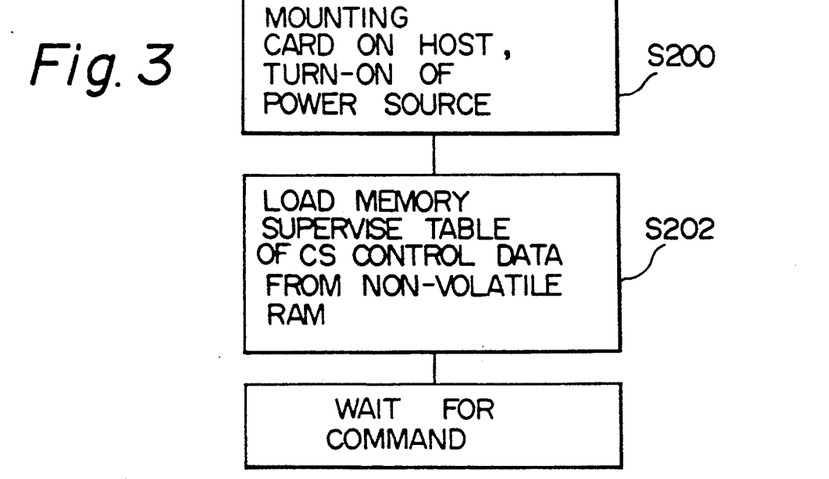
FIG. 3 is a flowchart demonstrating a specific operation of the embodiment.

As shown in FIG. 3, after the memory card has been mounted on an electronic still camera or similar host, the power source of the host is turned on (step S200). Then, the system control 32 is activated to send a busy signal to the host while loading the memory supervising table and the data representative of the selection state of the chip select control 28 from the non-volatile RAM 34 (S202). Then, the system control 32 turns off the busy signal and awaits a command from the host, i.e., a write signal WR or a read signal RD.

Figure 4:
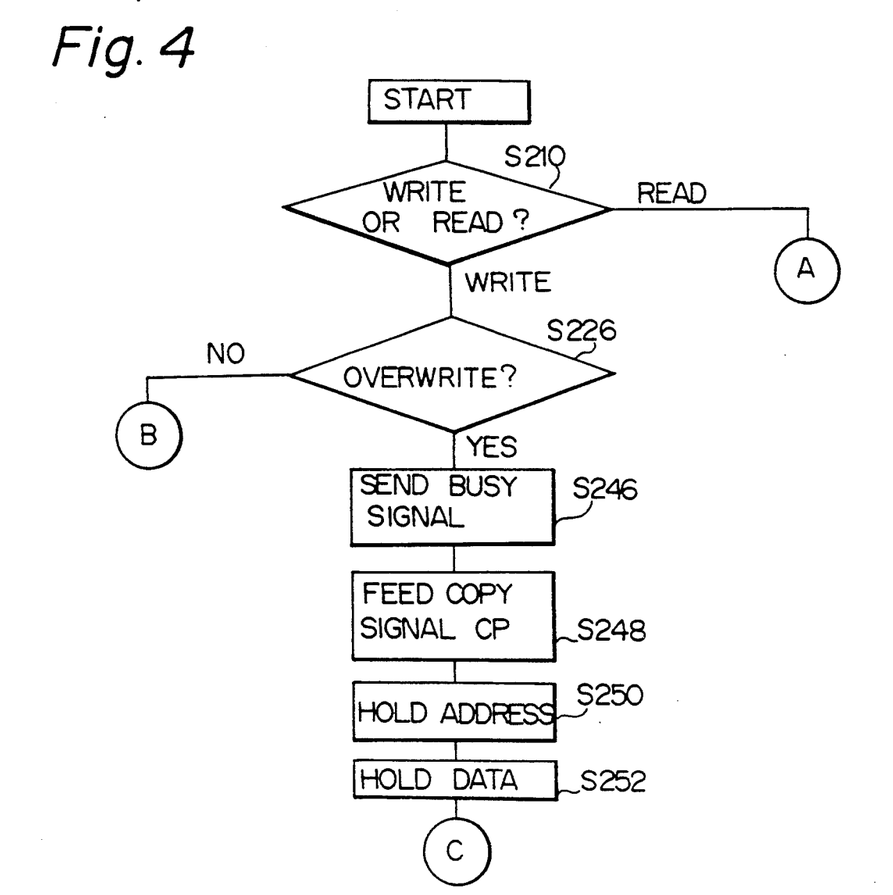
FIGS. 4, 5, 6 and 7 are flowcharts also demonstrating specific operations of the embodiment.
Figure 5:
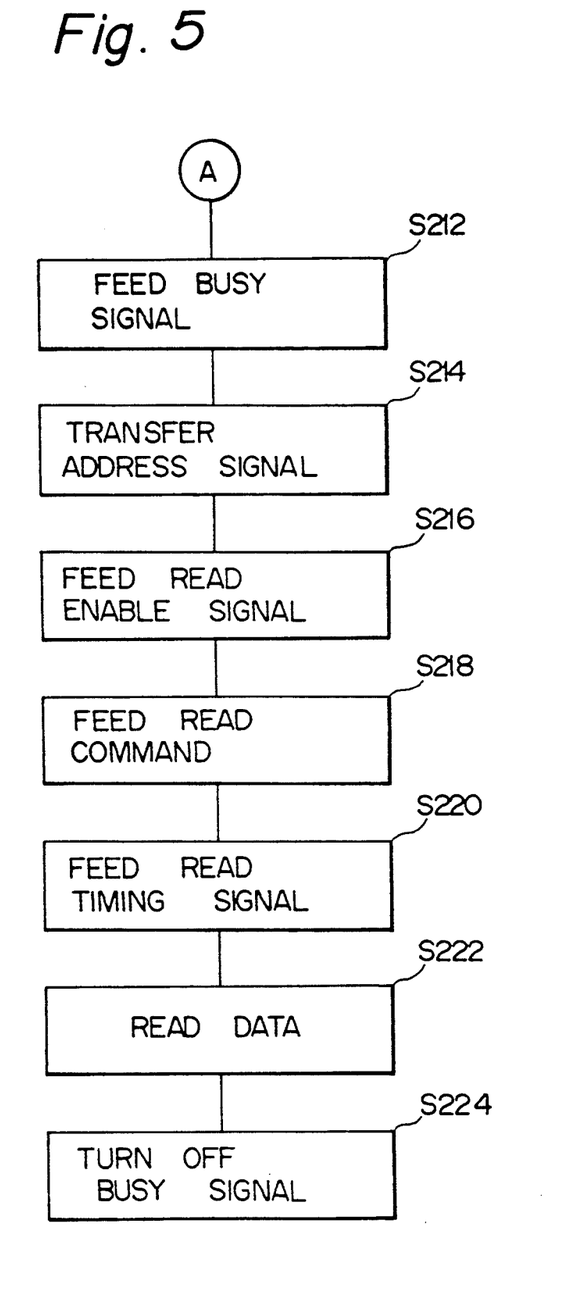

Referring to FIG. 4, on receiving a write signal WR or a read signal RD from the host, the system control 32 determines whether the signal is a write signal WR or whether the signal is a read signal RD (S210). As shown in FIG. 5, if the signal is a read signal RD, the system control 32 sends a busy signal to the host and waits for an address signal (S212). As an address signal from the host arrives, the system control 32 transfers the address signal to the main memory section 10 and the chip selection control 28 via the register (S214). In response, the chip selection control 28 feeds a read enable signal to a particular EEPROM chip designated by the address (S216). Further, the system control 32 feeds a read command signal OS to the control signal generator 30 (S218) which in turn delivers a read timing signal to the main memory section 10 (S220). As a result, data is read out of the EEPROM chip of interest via the data control 26 (S222). As one byte of data is fully read out, the system control 32 turns off the busy signal (S224) and then waits for the next command.

Figure 6:
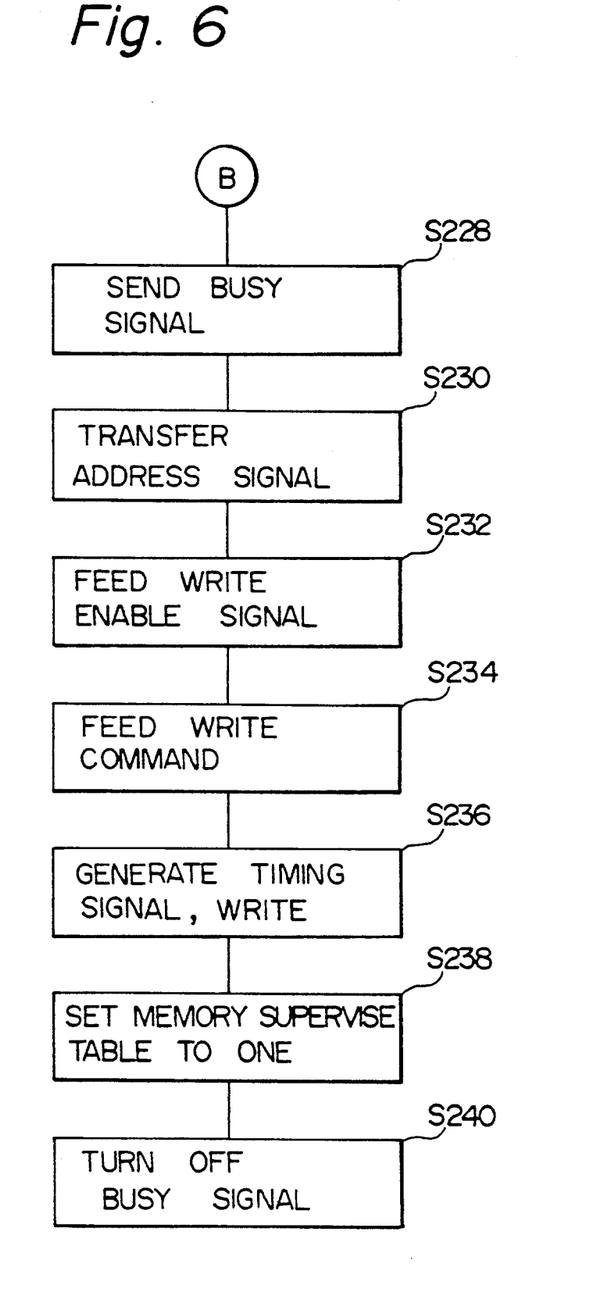

If the signal which arrives at the system control 32 is a write signal WR as determined in the step S210, FIG. 4, the system control 32 compares an address signal sent from the host with the memory supervising table to see if data should be overwritten in the EEPROM chip of interest (S226). If the answer of the step S226 is NO, a sequence of steps shown in FIG. 6 is executed. In FIG. 6, the system control 32 sends a busy signal to the host (S228) and then transfers the address signal sent from the host to the main memory section 10 and the chip selection control 28 via the address generator 24 (S230). In response, the chip selection control 28 feeds a write enable signal to the designated EEPROM chip (S232). Subsequently, on receiving data to be written from the host, the system control 32 delivers a write command signal OS to the control signal generator 30 (S234) which in turn feeds a write timing signal to the main memory section 10 (S236). As a result, the data transferred to the main memory section 10 via the data control 26 is written to the EEPROM chip of interest. As one byte of data is written in the EEPROM chip, the system control 32 sets ONE in the storage locations of addresses of the memory supervising table where the data have been written (S238). Thereafter, the system control 32 turns off the busy signal having been sent to the host and then awaits the next command from the host (S240).

Figure 2:
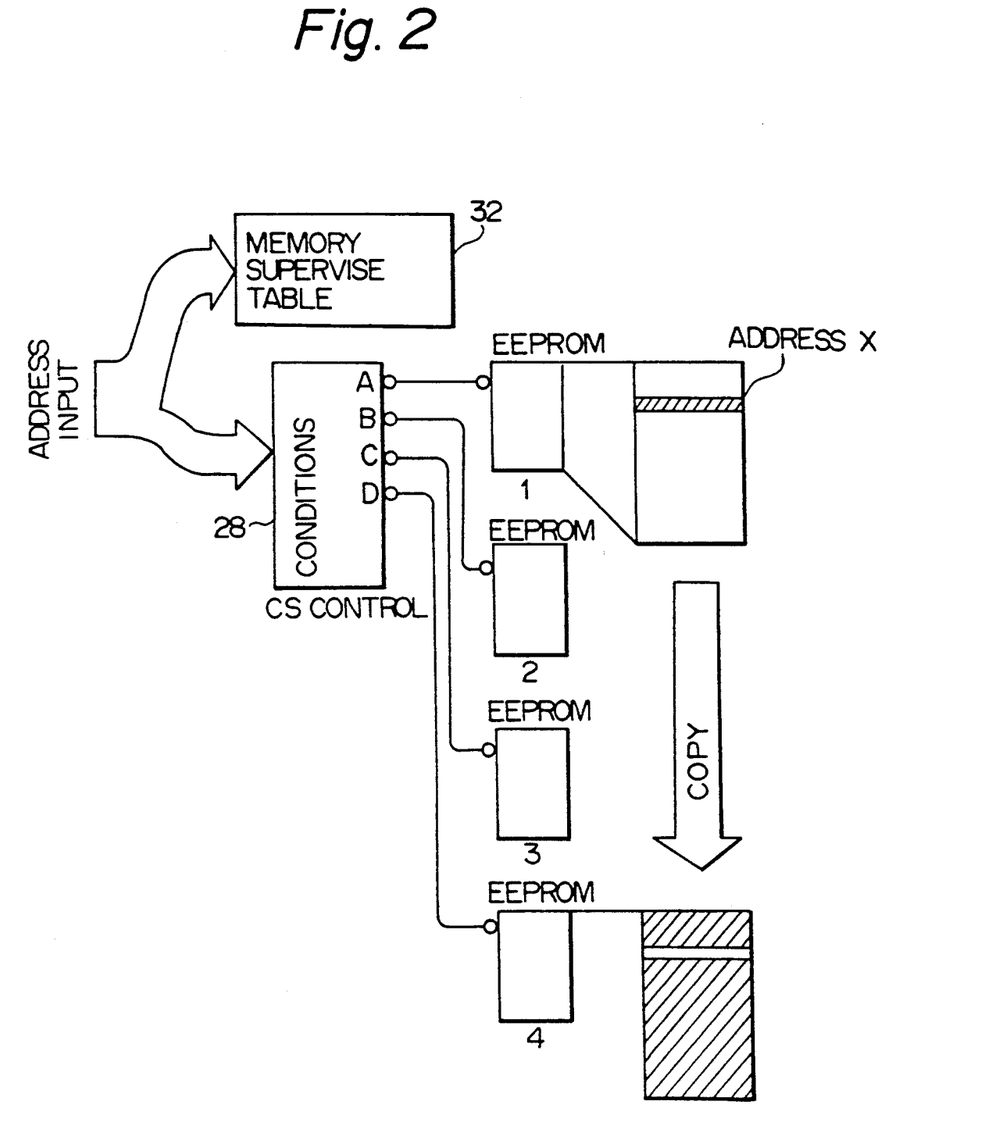
FIG. 2 is a schematic block diagram useful for understanding a data recording procedure particular to the embodiment.
Figure 7:
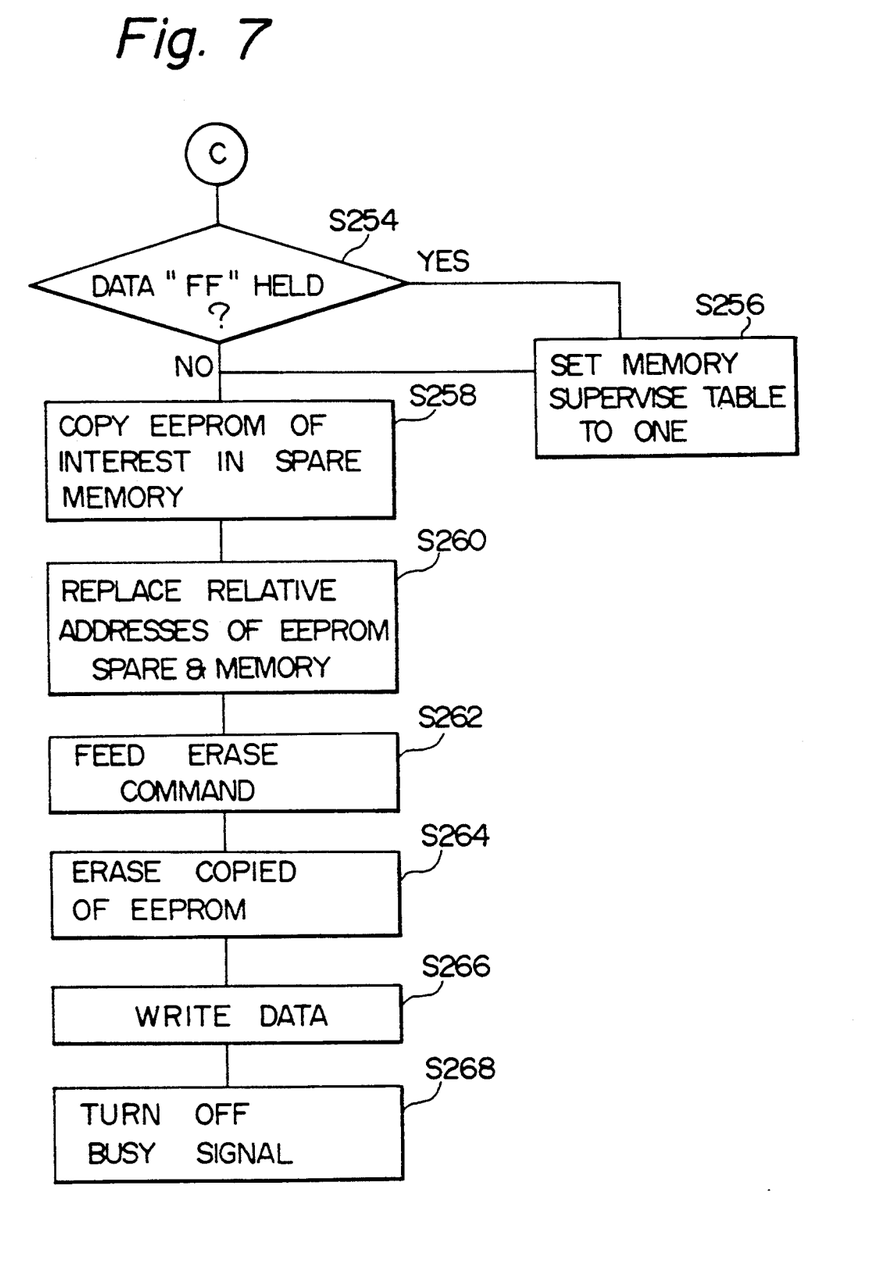

If data should be overwritten in the EEPROM chip of interest as determined in the step S226, FIG. 4, the system control 32 sends a busy signal to the host (S246) and then feeds a copy signal CP to the address generator 24 and data control 26 (S248). In response, the address generator 24 holds the address sent from the host (S250), while the data control 26 stores the data from the host in the first buffer memory thereof (S252). At this instant, as shown in FIG. 7, the system control 32 determines whether or not the data stored in the data control 26 is "FF", i.e., all ONEs (S254). If the answer of the step S254 is YES, the system control 32 sets ZERO in the storage location of the address of the memory supervising table (S256). This allows data to be written to the address of interest in a non-overwriting fashion afterwards. If the data stored in the data control 26 is not "FF" (NO, S254), the system control 32 executes the next processing while maintaining the memory supervising table in ONE. For example, as shown in FIG. 2, assume that the EEPROM chip 1 is the designated memory or memory of interest, that the EEPROM chip 4 is the spare memory, and that data should be overwritten in the address X of the EEPROM chip 1. Then, the system control 32 delivers to the chip selection control 28 a select signal SS for causing the chip selection control 28 to feed a read enable signal to the EEPROM chip 1 and a write enable signal to the EEPROM chip 4. As a result, the EEPROM chip 1 becomes ready to read data while the EEPROM chip 4 becomes ready to write data. The address generator 24 sequentially generates addresses for copying data except for the address which it holds. Further, the control signal generator 30 feeds a read timing signal and a write timing signal to the EEPROM chips 1 and 4, respectively. Consequently, data stored in the EEPROM chip 1 except for the data in the address X are sequentially read out by the data control 26 byte by byte while being sequentially written to the EEPROM chip 4, i.e., the data of the EEPROM chip 1 are copied in the EEPROM chip or spare memory 4 (S258). Then, the chip selection control 28 replaces the relative addresses of the two EEPROM chips 1 and 4 by, for example, replacing the numbers assigned thereto (S260). In this condition, the system control 32 feeds an erase command to the control signal generator 30 for erasing the contents of the EEPROM chip 1 (S262). In response, the control signal generator 30 delivers an erase timing signal to the main memory section 10. As a result the data stored in the EEPROM chip 1 are erased with the result that the EEPROM chip 1 turns out to be a spare memory (S264). Subsequently, the address generator 24 feeds the address signal held in the register thereof to the chip selection control 28 and the main memory section 10. At the same time, the data control 28 transfers the data held therein to the main memory section 10. As the control signal generator 30 generates a write timing signal, the data is written to the memory location corresponding to the address X of the EEPROM chip 4 (S266). Thereafter, the system control 32 turns off the busy signal having been sent to the host and waits for the next command from the host (S268). In this manner, the embodiment writes or reads one byte of data at a time and repeats such an operation to record or reproduce a desired amount of data.

As stated above, the illustrative embodiment has at least more than two collective erasure type EEPROM chips and constantly conditions at least one of them for a spare memory. In response to an access which needs overwriting, the embodiment copies the contents of a designated EEPROM chip except for the address of interest in the spare memory and thereby replaces the chips. This allows data to be rewritten without resorting to an erase command otherwise sent from a host to the chip which was a spare memory. Hence, it is not necessary to provide the memory card with extra pins for erasure, and collective erasure type EEPROM chips can be dealt with in the same manner as block erasure type EEPROM chips. The embodiment, therefore, provides a memory card system operable with both a memory card with an SRAM and a memory card with an EEPROM.

Since the embodiment replaces EEPROM chips in response to every access of the kind needing overwriting, all the chips are evened up in respect of the number of times of access. This prevents overwriting from concentrating on a particular EEPROM chip and thereby extends the life of the entire chips which inherently cannot be rewritten more than a certain number of times.

In the embodiment shown and described, the write-in, read-out and memory supervision are effected on a byte basis. Alternatively, when data are handled block by block as in the case of a file, such operations each may be executed on a block basis. While the control section 20 is shown as being provided with the connector 22, the control section 20 may be built in the host in which case only the main memory section 10 will be configured as a card.

Figure 8:
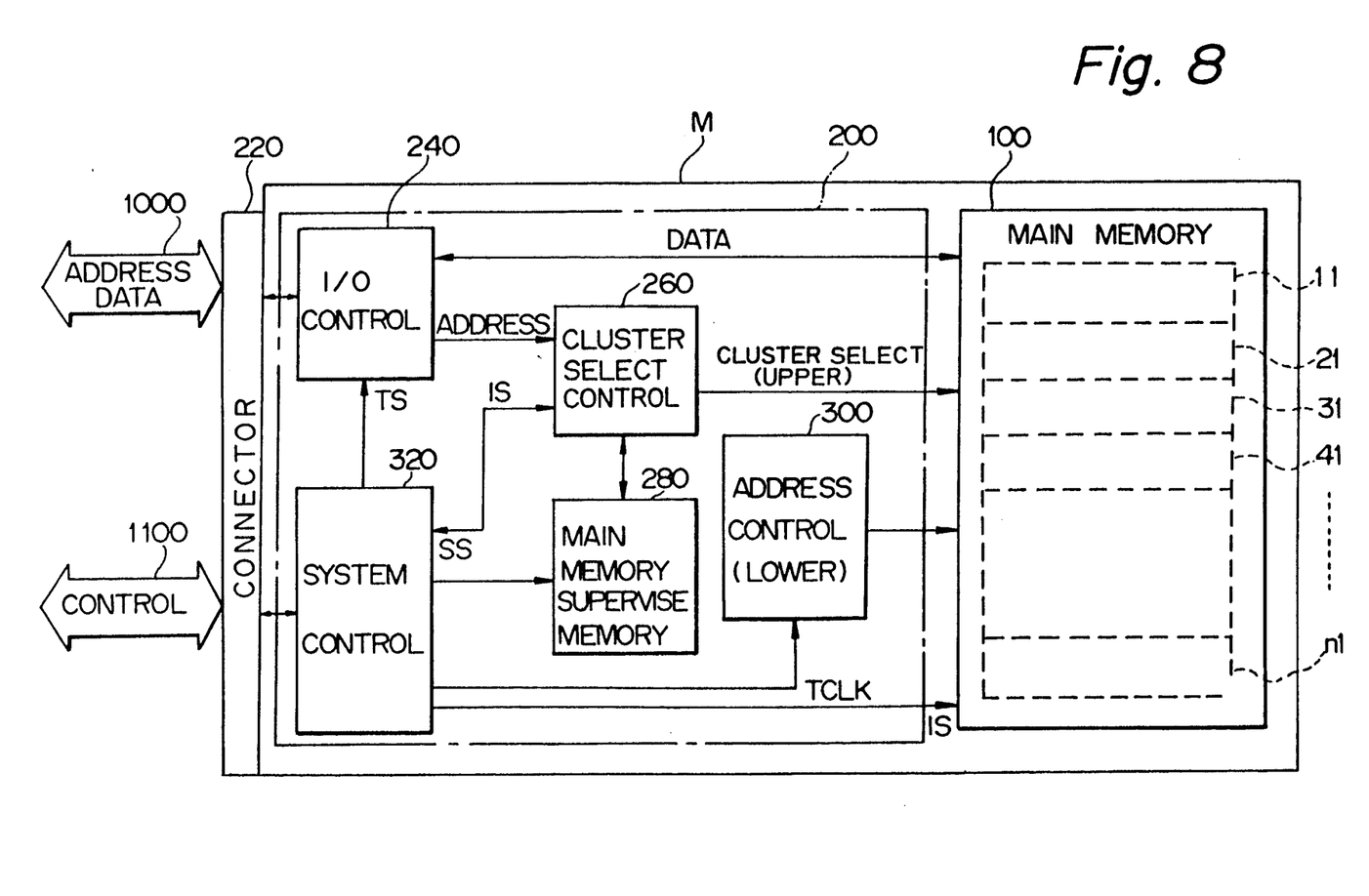
FIG. 8 is a block diagram schematically showing an alternative embodiment of the present invention.
Figure 9:
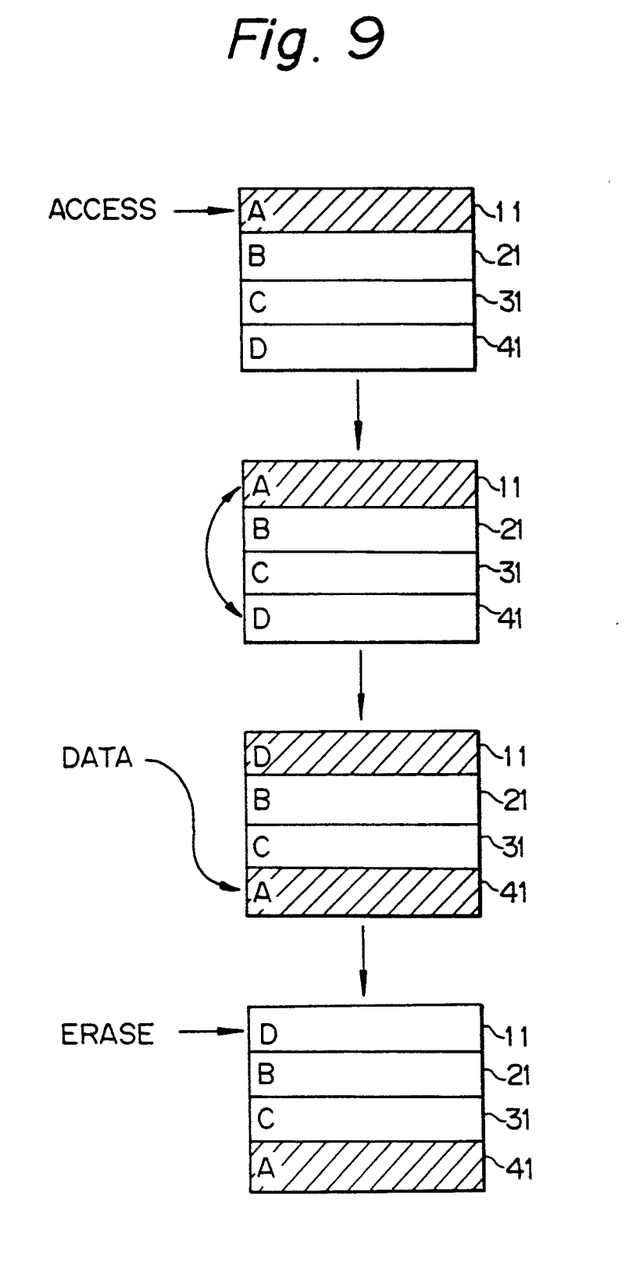
FIG. 9 depicts a recording method particular to the embodiment shown in FIG. 8.

Referring to FIGS. 8 and 9, an alternative embodiment of the present invention will be described. As shown, a memory card, generally M, has a main memory section 100 for storing data, and a control section 200 for controlling the writing and reading of data out of the main memory section 100. The memory card M is connectable to an electronic still camera, a reproducing apparatus or a similar host via a connector 220 thereof.

The main memory section 100 is implemented as a block erasure type EEPROM having a plurality of memory blocks 11, 21, ..., n1. The memory blocks 11-n1 each constitutes a single cluster capable of storing, for example, one frame of picture data. Among the plurality of clusters 11-n1, at least one cluster is conditioned for a spare cluster at all times which does not store any data and will be used in the event of overwriting. Specifically, as shown in FIG. 9, assume that an access of the kind needing overwriting is made to the cluster 11, for example. Then, the relative addresses A and D of the clusters 11 and 41 are replaced. In this condition, data is written to the cluster 41 whose address is now A while data stored in the cluster whose address is now D is erased. As a result, one or more spare clusters exist in the main memory section 100 at all times. When an erase signal is fed to any of the clusters 11-n1, all the data stored therein are changed to ONE and thereby erased.

Referring again to FIG. 8, the control section 200 has an I/O (Input/Output) control 240, a cluster selector 260, a main memory supervising memory 280, an address control 300, and a system control. The I/O control 240 executes processing for inputting and outputting addresses and data. The cluster selector 260 selects a particular one of the clusters 11-n1 for writing or reading data. The main memory supervising memory 280 supervises the relative addresses of the clusters 11-n1 of the main memory 100 as well as the conditions in which data are stored in the clusters 11-n1. The address control 300 controls the lower address of a cluster selected. The system control 320 controls the operations of the various blocks 240-300.

The I/O control 240 has an address register and a data register, not shown, each being operated by a timing signal TS which is fed from the system control 320. The address register reads a write address or a read address sent from the host via the connector 220 and transfers the address to the cluster selection control 260. The data register implements the hand-over of data between the host and the main memory section 100.

The cluster selection control 260 selects particular one of the clusters 11-n1 of the main memory section 100 matching an address which is transferred thereto via the I/O control 240. In this particular embodiment, the cluster selection control 260 has three different functions, as follows. When the address read is a write address, the cluster selection control 260 determines whether or not data is present in a cluster corresponding to the write address and stored in the main memory supervising memory 280. If the result of such a decision indicates that data is present in the cluster of interest, the cluster selection control 260 replaces the relative addresses of the cluster of interest and the spare cluster in the supervising memory 280 and then writes the replaced relative addresses in the supervising 280. Further, the cluster selection control 260 selects the cluster which was the spare cluster as a cluster corresponding to the logical address read.

The main memory supervising memory 280 includes a non-volatile RAM or a similar non-volatile memory and holds data stored in the memory card M even when the memory card M is removed from the host. The supervising memory 280 has addresses corresponding to the relative addresses of the clusters 11-n1 of the main memory section 100 and memorizes whether or not data is present on a cluster basis. For example, if data is present in any of the clusters 11-n1, a flag which is ONE is written to the memory location of the corresponding address of the supervising memory 280. Otherwise, a flag which is ZERO is written to the location of such an address of the supervising memory 280. In the event of write-in or erasure, the above-mentioned flag is rewritten.

The address control 300 is implemented by an address counter. By counting a timing clock fed from the system control 320, the address control 300 feeds to the main memory section 100 the lower address for the byte-by-byte reading or writing of the cluster which is selected by the cluster selection control 260.

The system control 320 receives a write signal or a read signal from the host via the connector 220 and in turn feeds corresponding control signals to the various blocks 240-300. Specifically, when a control signal arrives at the system control 320 via the connector 220, the system control 320 feeds an identification signal IS indicative of read-out or write-in to the main memory section 100 and the cluster selection control 260. At the same time, the system control 320 sends a busy signal to the host to show the latter that processing is under way. The system control 320 delivers a timing signal TS for writing or reading to the I/O control 240 and delivers, in synchronism with the timing signal TS, a timing clock TCLK to the address control 300 and the main memory section 100. Furthermore, when the relative addresses are replaced in the main memory supervising memory 280 in response to an access of the kind needing overwriting, the cluster selection control 260 feeds a switch signal SS to the system control 320. In response, the system control 320 effects control for erasing the data holding cluster whose address is now the address of a spare cluster in the supervising memory 280. Specifically, the system control 320 reads the address of the spare cluster out of the supervising memory 280, transfers the address to the cluster selection control 260 to select a cluster to be erased, and delivers an erase signal to the main memory section 100 to form a spare block.

The connector 220 for connecting the control section 200 to the host has terminals connectable to an address-/data bus 1000 assigned to addresses and data and a control bus 1100 assigned to control signals. Specifically, the address/data bus 1000 sends a write address or a read address and data following the write address to the memory card M, while sending data read out to the memory card M. The control bus 1100 sends a write signal and a read signal to the memory card M while sending a busy signal from the system control 320 to the host.

The operation of the memory card M having the above configuration and the data recording method will be described hereinafter.

The operator mounts the memory card M on the host by connecting the connector 220 to the address/data bus 1000 of the host. Assume that the host is an electronic still camera or a similar apparatus for recording data. Then, as the host sends a write signal to the memory card M over the control bus 1100, the system control 320 determines whether the input signal is a write signal or whether the input signal is a read signal. In this case, since the input signal is a write signal, the system control 320 delivers a timing signal TS for reading an address to the I/O control 240 and, at the same time, delivers an identification signal representative of a write signal to the cluster select control 260. In response to the timing signal TS, the I/O control 240 stores a write address in the address register thereof when the write address is fed from the host, while transferring the write address to the cluster selection control 260. On receiving the write address, the cluster selection control 260 looks up the main memory supervising memory 280 to see if the cluster corresponding to the write address stores any data. If the cluster of interest does not store data, the cluster control 260 feeds a cluster select signal designating the leading address of such a cluster to the main memory section 100. On the arrival of data to be written from the host, the I/O control 240 stores the data in the data register thereof and transfers the data to the main memory section 100 in synchronism with the timing signal TS fed from the system control 320. At this instant, the system control 320 delivers a timing signal TCLK for writing data to the address control 300 and main memory section 100. As a result, the main memory section 100 writes, one byte at a time, the data transferred from the I/O control 240 in the cluster selected by the cluster section control 260, on the basis of the address signal from the address control 300. On completing the writing operation, the system control 320 writes a flag which is ONE in the memory location of the corresponding address of the supervising memory 280, turns off the busy signal, and then awaits the next command from the host.

Assume that the access from the host to the memory card M is of the kind needing overwriting. Then, as the I/O control 240 transfers the address to the cluster selection control 260, the control 260 checks the supervising memory 280 to see if the cluster designated by the address stores data. If the cluster of interest stores data, the cluster selection control 260 replaces the relative addresses of the cluster of interest and spare cluster, writes the replaced addresses in the supervising memory 280, and then accesses the cluster which was a spare cluster to write data therein. At the same time, the cluster selection control 260 feeds a switch signal SS to the system control 320. The system control 320 in turn delivers a timing signal TS to the I/O control 240 while delivering a timing clock TCLK to the main memory section 100. Consequently, data fed from the host are sequentially written to the cluster of the main memory section 100 which was a spare cluster via the data register of the I/O control 240, byte by byte. As all the data have been written to the cluster which was a spare cluster, the system control 320 reads the address of the cluster which is now a spare cluster out of the supervising memory 280 and then transfers the address to the cluster selection control 260. This causes the cluster selection control 260 to select the new or substitute spare cluster. The system control 320 feeds an erase signal to the main memory section 100 with the result that the contents of the substitute spare cluster are erased. On completing the erasure, the system control 320 turns off the busy signal and then awaits the next command.

As stated above, the illustrative embodiment is operable without resorting to any substantial erase command from the host and, therefore, makes it needless to provide the connector 220 of the memory card M with extra pins for erasure. This renders the memory card M compatible with a memory card which uses an SRAM, regarding the hardware. Since the relative addresses of clusters are replaced in the event of rewriting of data, the clusters are leveled up to the number of times that they are used, i.e., rewriting of data is prevented from concentrating on a particular cluster. This is successful in extending the life of EEPROMs, i.e., the life of the memory card M.

Assume that the host on which the memory card M is mounted is a reproducing apparatus. Then, the host sends a read signal to the memory card M over the control bus 1100. In response, the system control 320 of the memory card M feeds an identification signal ID for read-out to the cluster selection control 260 and the main memory section 100. At the same time, the system control 320 feeds a timing signal TS for read-out to the I/O control 240. Then, the I/O control 240 transfers a read address to the address selection control 260 when the read address is sent from the host. In response, the cluster selection control 260 delivers a signal for selecting a cluster designated by the address to the main memory section 10. At this instant, the system control 320 feeds a timing clock TCLK for read-out to the address control 300 and main memory section 100. As a result, data are read out of the cluster of interest of the main memory section 100 and sent to the host via the I/O control 240, one byte at a time. When all the data have been read out of the designated cluster, the system control 320 turns off the busy signal and then awaits a command from the host.

The embodiment has been described as rewriting data by replacing the clusters, writing data in the cluster which was a spare cluster, and then erasing the cluster which is a substitute spare cluster. Alternatively, the embodiment may be so modified as to interchange the clusters, erase the cluster which is a new spare cluster, and then write data in the cluster which was a spare cluster.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A method of recording data in a memory card having a main memory which is implemented by a collective erasure type EEPROM (Electrically Erasable Programmable Read Only Memory), said method comprising the steps of:

providing said memory card with at least two EEPROMs having an identical capacity, and conditioning at least one of said EEPROMs for a spare memory in which no data is stored;

copying, in response to an access which is to rewrite data stored in one of said EEPROMs, all of said data of said one EEPROM except for data stored in a storage location of an address to rewrite in said spare memory;

replacing a relative address of said spare memory and a relative address of said one EEPROM to convert said spare memory to a data holding memory;

collectively erasing said one memory to convert said one memory to a spare memory; and writing in a storage location of a non-occupied address of said EEPROM having been converted to a data holding memory data which had been interrupted, thereby rewriting data.

2. A memory card system using a memory card which has a main memory implemented as a collective erasure type EEPROM, comprising:

a main memory section made up of at least two EEPROMs having an identical capacity, at least one of said EEPROMs being conditioned for a spare memory in which no data is stored;

an address generator for holding a write address of data to be written to said main memory section and generating, when one of said EEPROMs corresponding to said write address has already stored data, addresses for copying all of said data stored in said one EEPROM except for data stored in a storage location of said write address in said spare memory;

a data controller for writing and reading data out of said main memory section and temporarily holding, while data of said one EEPROM are copied in said spare memory in said main memory section, data to be written;

a chip selection controller for selectively feeding an enable signal to one of said EEPROMs for writing or reading data and replacing, when data of one of said EEPROMs are copied in said spare memory in said main memory section, a relative address of said one EEPROM and a relative address of said spare memory;

table holding means for storing a memory supervising table which supervises storage conditions of said main memory section when a power source is turned off, and a selection condition of said chip selection controller just before the turn-off of said power source;

a control signal generator for generating a timing signal for writing data in said EEPROMs of said main memory section, a timing signal for reading data out of said EEPROMs, and a timing signal for erasing data stored in said EEPROMs; and a system control for determining, in response to an input signal or an output signal from a host to or from which data are to be inputted or outputted, conditions of said main memory section on the basis of contents of said memory supervising table to thereby control said main memory section, said address generator, said data controller, said chip selection controller, said table holding means, and said control signal generator, thereby moving, writing or reading data.

3. A method of recording data in a memory card having a main memory implemented as a block erasure type EEPROM, comprising the steps of:

conditioning at least one of a plurality of memory blocks constituting said EEPROM for a spare block in which no data is stored;

replacing, when an access of the kind needing overwriting is made to any one of said memory blocks which store data, a relative address of said one memory block and a relative address of said spare block;

erasing data stored in said one memory block to convert said one memory block to a substitute spare block; and writing data associated with said access in said one memory block which was a spare block so as to convert said one memory block to a data holding block.

4. A memory card system using a memory card having a main memory which is implemented as a block erasure type EEPROM, comprising:

a main memory section comprising said block erasure type EEPROM having a plurality of memory blocks at least one of which is conditioned for a spare block in which no data is stored;

a main memory supervising memory for memorizing relative addresses of said memory blocks of said main memory section, whether or not each of said memory blocks stores data, and conditions in which said memory blocks hold data;

a block selector for reading a logical address sent from a host and selecting one of said memory blocks which is designated by said logical address; and a system controller for controlling said main memory section, said main memory supervising memory, and said block selector in response to a control signal sent from the host;

said block selector comprising, decision means for reading and determining, when said logical address is an address for writing, conditions in which data are stored in storage locations of addresses of said memory block stored in said main memory supervising memory, replacing means for replacing, when said decision means determines that said memory block stores data, a relative address of said memory block and a relative address of said spare block and then writing said replaced relative addresses in said main memory supervising memory and selecting means for selecting said memory block which was said spare block as a block designated by said logical address;

said system controller comprising erasing means for erasing data of said memory block whose address has been converted to the address of said spare block by said replacing means of said block selector.

* * * * *